United States Patent
Lou

(10) Patent No.: US 6,239,020 B1
(45) Date of Patent: May 29, 2001

(54) METHOD FOR FORMING INTERLAYER DIELECTRIC LAYER

(75) Inventor: Chine-Gie Lou, Hsinchu Hsien (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/429,190

(22) Filed: Oct. 28, 1999

(30) Foreign Application Priority Data

Aug. 23, 1999 (TW) ................................. 88114374

(51) Int. Cl.$^7$ .................................... H01L 21/4763
(52) U.S. Cl. .................... 438/624; 438/626; 438/631; 438/633; 438/634; 438/692; 438/697; 438/699
(58) Field of Search ................... 438/624, 626, 438/631, 633, 634, 692, 697, 699

(56) References Cited

U.S. PATENT DOCUMENTS

| | | | |
|---|---|---|---|
| 4,489,481 | * | 12/1984 | Jones ..................................... 438/623 |
| 5,279,983 | * | 1/1994 | Ahn ....................................... 438/396 |
| 5,288,655 | * | 2/1994 | Higasitani et al. ................... 438/396 |
| 5,313,417 | * | 5/1994 | Yanagi ................................. 438/624 |
| 5,340,774 | * | 8/1994 | Yen ....................................... 438/301 |
| 5,389,558 | * | 2/1995 | Suwanai et al. ..................... 438/241 |
| 5,602,050 | * | 2/1997 | Sudo ..................................... 438/241 |
| 5,629,224 | * | 5/1997 | Rostoket et al. ..................... 438/633 |
| 5,670,409 | * | 9/1997 | Otori et al. ........................... 438/626 |
| 5,688,720 | * | 11/1997 | Hayashi ................................ 438/633 |
| 5,869,392 | * | 2/1999 | Kimura ................................. 438/624 |
| 5,880,003 | * | 3/1999 | Hayashi ................................ 438/692 |
| 5,937,322 | * | 8/1999 | Matsuura ............................. 438/626 |
| 6,008,540 | * | 12/1999 | Lu et al. .............................. 257/758 |
| 6,087,250 | * | 7/2000 | Hyakutake ........................... 438/624 |

\* cited by examiner

*Primary Examiner*—John F. Niebling
*Assistant Examiner*—Lynne A. Gurley
(74) *Attorney, Agent, or Firm*—Jiawei Huang; J.C. Patents

(57) ABSTRACT

A method for fabricating an interlayer dielectric layer on a semiconductor substrate with a memory cell region and a periphery circuit region is described, wherein semiconductor devices are formed on the memory cell region and the periphery circuit region so as to result in a height variation therebetween. The present method comprises the steps of forming a first dielectric layer blanket-covering the semiconductor substrate, wherein a first height variation exists between the memory cell region and the periphery circuit region. Then, a stop layer is conformally blanket formed on the first dielectric layer. Next, a second dielectric layer is conformally formed on the stop layer. A chemical mechanical polishing process is executed on the second dielectric layer until the stop layer on the memory cell region is exposed. This formation of the structure of a first dielectric layer/stop layer/second dielectric layer is repeated at least two times to achieve a planarized interlayer dielectric layer. A cap layer is formed on the top surface of the planarized interlayer dielectric layer.

14 Claims, 3 Drawing Sheets

METHOD FOR FORMING INTERLAYER DIELECTRIC LAYER

CROSS-REFERENCE TO RELATED APPLICATION

This application claims the priority benefit of Taiwan application serial no. 88114374, filed Aug. 23, 1999.

BACKGROUND OF THE INVENTION

1. Field of Invention

The present invention relates to a method of fabricating an interlayer dielectric layer on a semiconductor substrate. More particularly, the present invention relates to a method for planarizing the interlayer dielectric layer on a semiconductor substrate.

2. Description of Related Art

In the structure of a semiconductor substrate with memory devices, such as dynamic random access memory (DRAM), the height variation between the memory cell region and periphery circuit region is big. The variation of height is caused by the enlargement of the surface of the bottom electrode at the memory cell for increasing the capacitance to a level sufficient to satisfy circuit demand. Therefore, the height of the bottom electrode causes the height variation between the memory cell region and periphery circuit region.

The big height variation between the memory cell region and the periphery circuit region will result in a poor pattern transfer for a metal interconnect in subsequent processing. Therefore, before fabricating the metal interconnect, the interlayer dielectric layer (ILD) should be planarized.

Conventionally, a planarized interlayer dielectric layer is fabricated by depositing boro-phosphosilicate glass (BPSG) with flowability on the surface of semiconductor devices and then chemical mechanical polishing (CMP) the BPSG layer. However, the planarized surface is only in the memory cell region or in the periphery circuit region, so the height variation between the memory cell region and the periphery circuit region is still significant.

FIGS. 1A to 1B schematically illustrate a conventional method for fabricating an interlayer dielectric layer on a semiconductor substrate. As shown in FIG. 1A, a semiconductor substrate 100 having a memory cell region 100a and a periphery circuit region 100b is provided. Semiconductor devices, such as capacitors or transistors have been formed on the semiconductor substrate. FIGS. 1A to 1B only show the height variation between the memory cell region 100a and the periphery circuit region 100b; the detailed arrangement of the semiconductor devices is not shown.

A silicon oxide layer 102 and boro-phosphosilicate glass (BPSG) layer 104 are deposited on the semiconductor substrate 100 by conventional chemical vapor deposition. The primary planarization on the memory cell region 100a and periphery circuit region 100b is provided by the flowability of the BPSG layer 104.

Referring to FIG. 1B, a chemical mechanical polishing (CMP) process is executed on the BPSG layer for further planarization of the same. Then, an oxide layer 106 is blanket-formed on BPSG layer 104 to cover up the damage thereon caused by CMP process. Therefore, a planarization of the interlayer dielectric layer is obtained only at the memory cell region 100a or the periphery circuit region 100b. However, the height variation between the memory cell region 100a and periphery circuit region 100b is still significant.

In addition, in the above-mentioned conventional method, the polishing of BPSG layer is controlled by the operation time. Therefore, it is not easy to control the polishing level of BPSG. Furthermore, due to the height difference between the memory cell region and the periphery circuit region on the semiconductor substrate, the polishing rate thereon is different so as to result in poor uniformity.

SUMMARY OF THE INVENTION

In one aspect, the present invention provides a method for fabricating an interlayer dielectric layer on a semiconductor substrate with a memory cell region and a periphery circuit region, such that the two regions together are nearly planar.

In another aspect, the present invention provides a method for fabricating an interlayer dielectric layer on a semiconductor substrate with a memory cell region and a periphery circuit region with excellent uniformity.

In still another aspect, the present invention provides a method for fabricating an interlayer dielectric layer on a semiconductor substrate with a memory cell region and a periphery circuit region, wherein a stop layer is provided during the operation of CMP on the interlayer dielectric layer. Therefore, the process window for fabricating the interlayer dielectric layer is enlarged.

In yet another aspect, the present invention provides a method for fabricating an interlayer dielectric layer on a semiconductor substrate with a memory cell and a periphery circuit region, the yield of which is increased.

According to the present invention, a method for fabricating an interlayer dielectric layer on a semiconductor substrate with a memory cell region and a periphery circuit region is disclosed, wherein semiconductor devices are formed on the memory cell region and the periphery circuit region so as to result in a height variation therebetween. The present method comprises the steps of forming a first dielectric layer blanket-covering the semiconductor substrate, wherein a first height variation exists between the memory cell region and the periphery circuit region. Then, a stop layer is conformally blanket-formed on the first dielectric layer. Next, a second dielectric layer is formed on the stop layer. A chemical mechanical polishing process is executed on the second dielectric layer until the stop layer on the memory cell region is exposed. This formation of the structure of a first dielectric layer/stop layer/second dielectric layer is repeated at least two times to achieve a planarized interlayer dielectric layer. A cap layer is formed on the top surface of the planarized interlayer dielectric layer.

In accordance with one embodiment of the present invention, the chemical mechanical polishing process is executed on the second dielectric layer to expose the stop layer on the memory cell region of the semiconductor substrate, while part of the second dielectric layer remains on the periphery circuit region. Hence, a second height variation between the memory cell region and the periphery circuit region is formed, wherein the second level difference is less than the first level difference.

Furthermore, in accordance with one embodiment of the present invention, the process route, formation of the structure of a dielectric layer/stop layer/dielectric layer and the execution of the CMP on the upper dielectric layer, is performed two times.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1B schematically illustrate a conventional method for fabricating an interlayer dielectric layer.

DESCRIPTION OF THE PREFERRED EMBODIMENTS

Figure 1A:
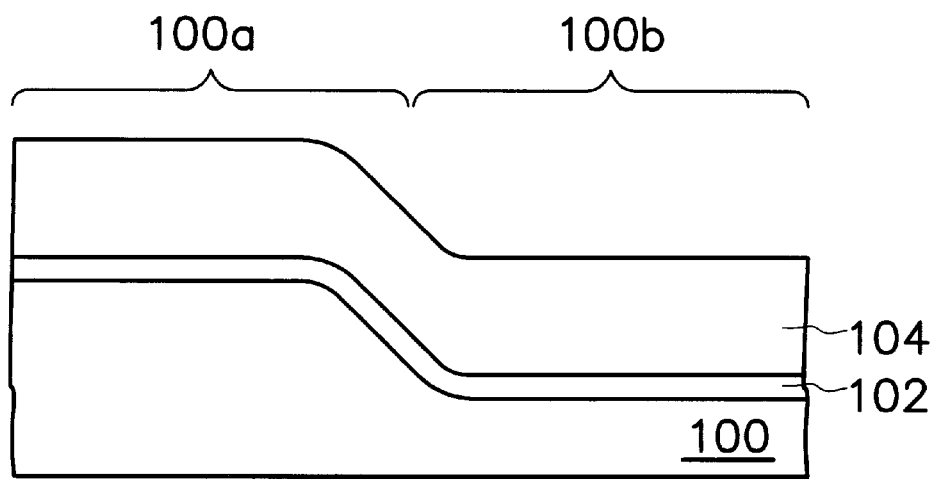
Figure 1B:
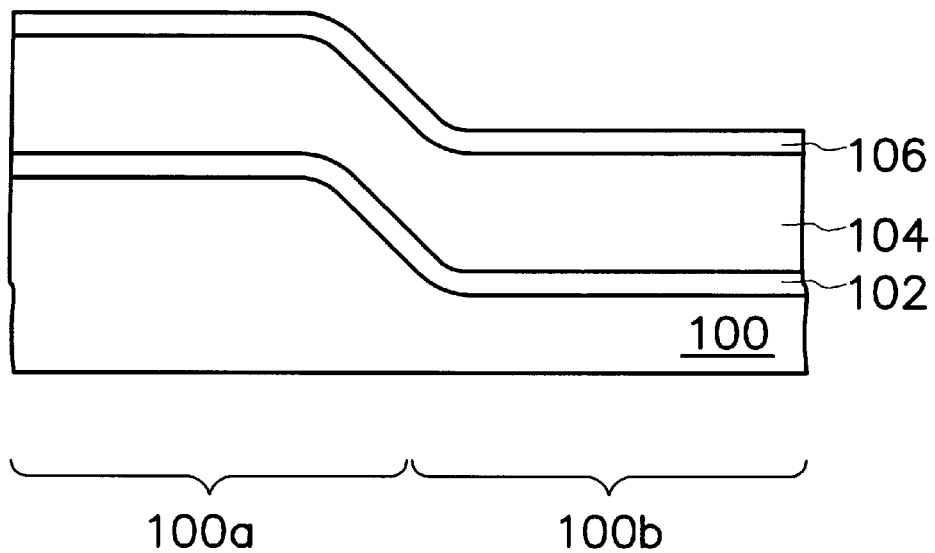

Reference will now be made in detail to the present preferred embodiments of the invention, examples of which are illustrated in the accompanying drawings. Wherever possible, the same reference numbers are used in the drawings and the description to refer to the same or like parts.

Figure 2A:
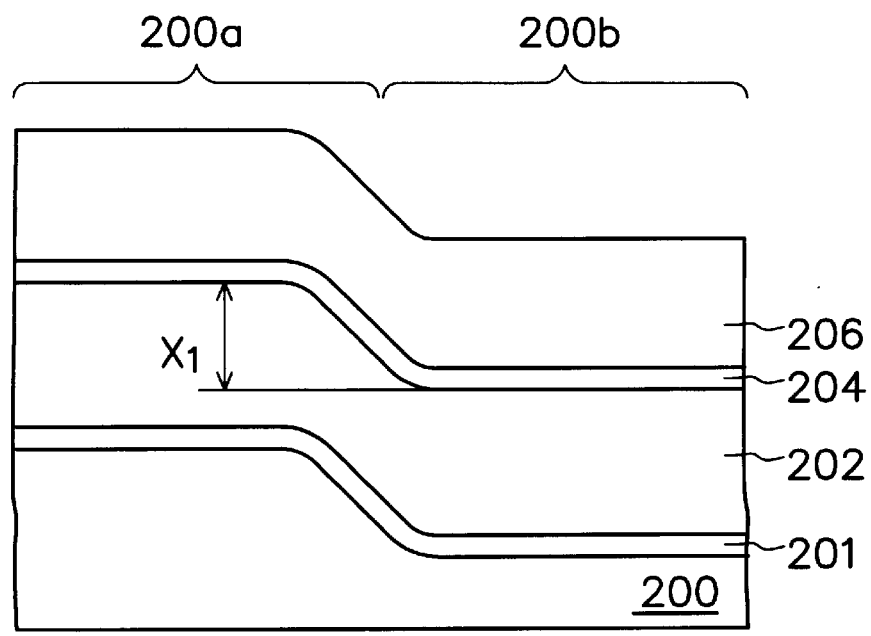
FIGS. 2A to 2C schematically illustrate a method for fabricating an interlayer dielectric layer according to a preferred embodiment of the present invention.

FIG. 2A schematically illustrates a method for fabricating an interlayer dielectric layer according to a preferred embodiment of the present invention. A semiconductor substrate 200 is provided, on which there are formed semiconductor devices. The semiconductor substrate 200 is divided into a memory cell region 200a and a periphery circuit region 200b, wherein a variation of height exists between the memory cell region 200a and the periphery circuit region 200b, as the former is higher than the latter. For simplicity, only the variation of height is shown in the drawings herein, rather than the detailed structures of the semiconductor devices thereon.

A thin oxide layer 201 is deposited on the substrate 200 by, for example, conventional chemical vapor deposition. Next, a dielectric layer 202 is formed on the oxide layer 201 by, for example chemical vapor deposition. Due to the height variation between the memory cell region 200a and the periphery circuit region 200b, the conformal dielectric layer 202 exhibits a height variation, X1, therebetween, as shown in FIG. 2A. The dielectric layer 202 is preferred but not limited to BPSG due to the flowability of BPSG.

Referring to FIG. 2A, a stop layer 204 is conformally formed on the dielectric layer 202 by, for example chemical vapor deposition. The stop layer 204 is preferably a nitride layer, such as a boron nitride layer.

Next, another dielectric layer 206 is formed on the stop layer 204. The formation process and the material of the dielectric layer 206 are the same as those of the dielectric layer 202.

Figure 2B:
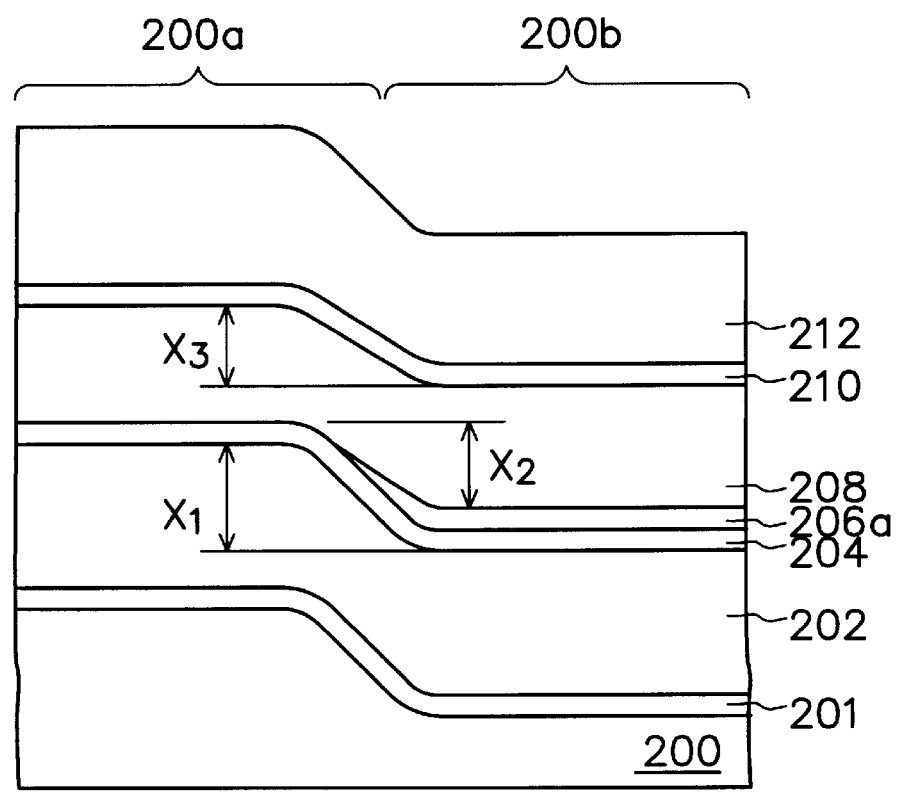

Turning to FIG. 2B, a chemical mechanical polishing process is executed on the dielectric layer 206 until the stop layer 204 is exposed in the memory cell region 200a. A portion of the dielectric layer 206 on the periphery circuit region 200b remains. Therefore, the variation of height, X2, between the memory cell region 200a and periphery circuit region 200b is reduced due to the remainder 206a of the dielectric layer 206 on the periphery circuit region 200b.

Still referring to FIG. 2B, the process for formation of a dielectric layer/stop layer/dielectric layer is repeated. A dielectric layer 208, a stop layer 210 and a dielectric layer 212 are subsequently conformally formed on the semiconductor substrate 200. The variation of height between the memory cell region 200a and the periphery circuit region 200b in the dielectric layer 208, X3, is less than that in the dielectric layer 202, X1.

Figure 2C:
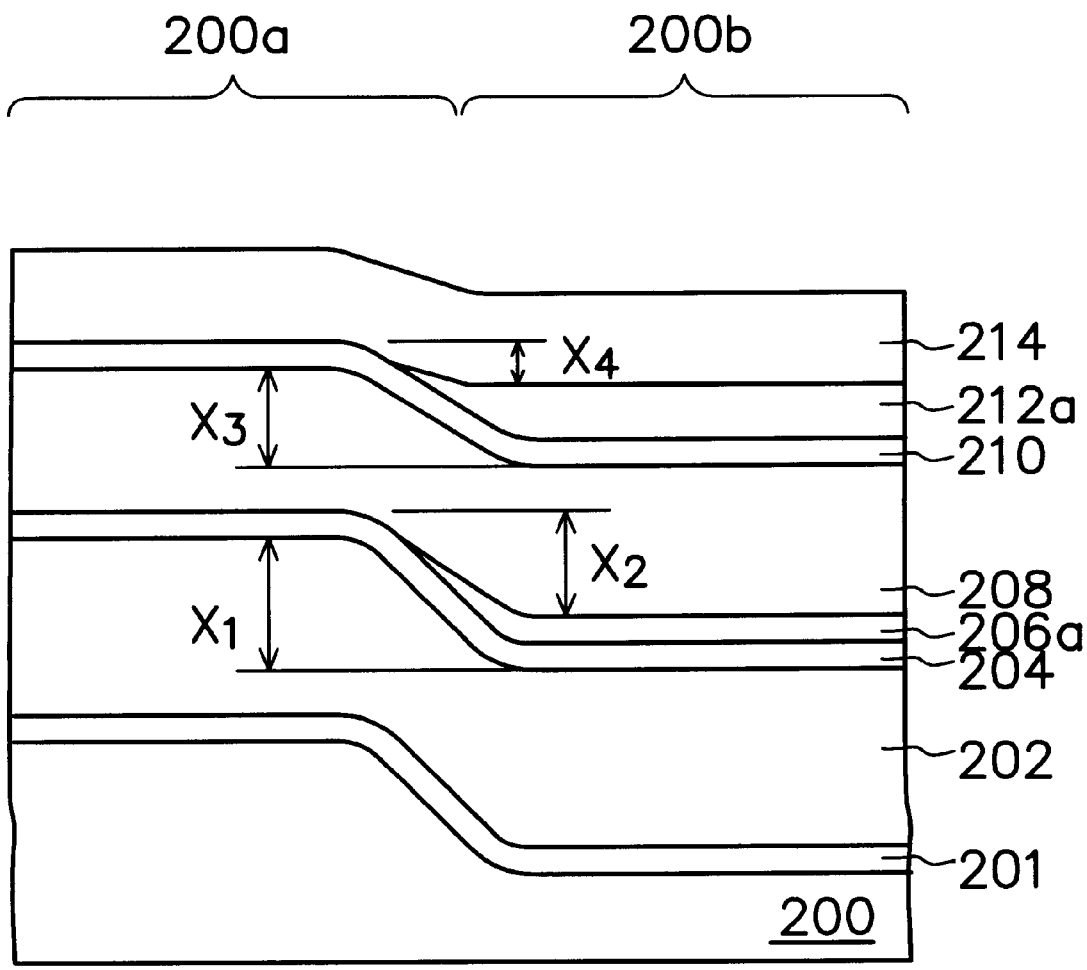

Turning to FIG. 2C, a chemical mechanical polishing process is executed on the dielectric layer 212 until the stop layer 210 is exposed in the memory cell region 200a. A portion of the dielectric layer 212 on the periphery circuit region 200b remains. Therefore, the variation of height, X4, between the memory cell region 200a and the periphery circuit region 200b is reduced due to the remainder 212a of the dielectric layer 212 in the periphery circuit region 200b. X4 is smaller than X3. Therefore, the variation of the height between the memory cell region 200a and the periphery circuit region 200b is reduced until both layers are nearly coplanar.

Next, a cap oxide layer 214 is blanket formed on the semiconductor substrate 200 to cover the exposed stop layer 210 and the remainder of the dielectric layer 212a to complete the formation of the interlayer dielectric layer.

In accordance with the method of the present invention, the interlayer dielectric layer is formed by formation of a stack layers of a dielectric layer/stop layer/dielectric layer and execution of a CMP process on the upper dielectric layer, wherein the stop layer serves as an endpoint of polishing process. Note that the thickness of the interlayer dielectric layer fabricated by the present invention is controlled so as to be similar to that of the interlayer dielectric layer fabricated by the conventional method. Furthermore, the formation of the stack layers and the execution of the CMP process can be repeated at least two times until obtaining the desired planarization between the memory cell region and the periphery circuit region on the semiconductor substrate.

Furthermore, according to the present invention, the stop layer of the stack layers serves as an endpoint during the operation of CMP. Therefore, the process window for fabricating the interlayer dielectric layer is enlarged.

In addition, due to the nearly planarized interlayer dielectric layer between the memory cell region and the periphery circuit region on the semiconductor substrate, the process window for the subsequent process is enlarged and furthermore, increases the yield of the products.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an interlayer dielectric layer on a semiconductor substrate with a memory cell region and a periphery circuit region, wherein semiconductor devices are formed on the memory cell region and the periphery circuit region having a height variation therebetween, comprising the steps of:

a) forming a first dielectric layer blanket-covering the semiconductor substrate, wherein a first height variation exists between the memory cell region and the periphery circuit region;

b) conformally forming a first stop layer that blanket-covers the first dielectric layer;

c) forming a second dielectric layer on the first stop layer;

d) executing a chemical mechanical polishing process on the second dielectric layer until the first stop layer on the memory cell region is exposed and a part of the second dielectric layer remains on the periphery circuit region;

e) forming a third dielectric layer blanket-covering the exposed first stop layer and the remainder of the second dielectric layer, wherein a second height variation exists between the memory cell region and the periphery circuit region;

f) conformally forming a second stop layer that blanket-covers the third dielectric layer;

g) forming a fourth dielectric layer on the second stop layer;

h) executing a chemical mechanical polishing process on the fourth dielectric layer until the second stop layer on the memory cell region is exposed and a part of the fourth dielectric layer remains on the periphery circuit region; and i) forming a cap layer on the top surface of the exposed second stop layer and the fourth dielectric layer.

2. The method of claim 1, further comprising, after step (h), repeating steps (e) to (h) at least one more time.

3. The method of claim 1, wherein the first stop layer and the second stop layer include boron nitride.

4. The method of claim 1, wherein the first, second, third and fourth dielectric layers include boro-phosphosilicate glass (BPSG).

5. The method of claim 1, wherein the cap layer includes a silicon oxide.

6. The method of claim 1, wherein the first height variation is bigger than the second height variation.

7. The method of claim 1, wherein a third height variation of the exposed first stop layer and the remainder of the second dielectric layer on the periphery circuit region is less than the first height variation.

8. The method of claim 1, further comprising, before the formation of the first dielectric layer, a step of forming a thin oxide layer blanket-covering the memory cell region and the periphery circuit region.

9. A method for fabricating an interlayer dielectric layer on a semiconductor substrate with a memory cell region and a periphery circuit region, wherein semiconductor devices are formed on the memory cell region and the periphery circuit region having a height variation therebetween, comprising the steps of:

forming a first dielectric layer blanket-covering the semiconductor substrate, wherein a first height variation exists between the memory cell region and the periphery circuit region;

conformally forming a stop layer blanket-covering the first dielectric layer;

forming a second dielectric layer on the stop layer;

executing a chemical mechanical polishing process on the second dielectric layer until the stop layer on the memory cell region is exposed and a part of the second dielectric layer remains on the periphery circuit region; and repeating the above steps once again.

10. The method of claim 9, wherein the stop layer include boron nitride.

11. The method of claim 9, wherein the first and second dielectric layers include boro-phosphosilicate glass (BPSG).

12. The method of claim 9, further comprising, after repeating all the steps, a step of conformally forming a cap layer on the semiconductor substrate.

13. The method of claim 12, wherein the cap layer includes a silicon oxide.

14. The method of claim 9, further comprising, before the formation of the first dielectric layer, a step of forming a thin oxide layer blanket-covering the memory cell region and the periphery circuit region.

* * * * *